United States Patent [19]

Itozaki et al.

[11] Patent Number: 5,252,547
[45] Date of Patent: Oct. 12, 1993

[54] METHOD OF FORMING AN INORGANIC PROTECTIVE LAYER ON AN OXIDE SUPERCONDUCTING FILM

[75] Inventors: Hideo Itozaki; Saburo Tanaka; Nobuhiko Fujita; Shuji Yazu; Tetsuji Jodai, all of Hyogo, Japan

[73] Assignee: Sumitomo Electric Industries, Ltd., Osaka, Japan

[21] Appl. No.: 593,990

[22] Filed: Oct. 9, 1990

Related U.S. Application Data

[62] Division of Ser. No. 215,497, Jul. 6, 1988.

[30] Foreign Application Priority Data

| Jul. 6, 1987 | [JP] | Japan | 62-168357 |
| Jul. 6, 1987 | [JP] | Japan | 62-172696 |
| Jul. 10, 1987 | [JP] | Japan | 62-168356 |
| Jul. 10, 1987 | [JP] | Japan | 62-172697 |
| Jul. 10, 1987 | [JP] | Japan | 62-172698 |
| Jul. 17, 1987 | [JP] | Japan | 62-178600 |

[51] Int. Cl.$^5$ .............................................. B05D 5/12
[52] U.S. Cl. .................................. 505/1; 505/731; 505/732; 505/730; 427/62; 427/419.3; 427/419.2; 427/419.7; 427/314; 427/126.3; 204/192.24; 204/192.22; 204/192.23; 428/930
[58] Field of Search ............... 505/1, 732, 731, 730, 505/742; 427/62, 63, 419.1, 419.3, 419.2, 419.7, 314, 126.3; 428/698, 702, 930; 204/192.24, 192.22, 192.23

[56] References Cited

U.S. PATENT DOCUMENTS

3,905,037  9/1975  Bean et al. ......................... 357/60
4,866,032  9/1989  Fujimori et al. ....................... 505/1
4,916,116  4/1990  Yamazaki ............................. 505/1

OTHER PUBLICATIONS

Ichikawa et al, "Effect of Overcoating With Dielectric Films on the Superconductive Properties of the High-$T_c$ Y-Ba-Cu-O Films", Jpn. J. Appl. Phys. 27(3) Mar. 1988 L381-383.
Maeda et al, "A new high-$T_c$ oxide superconductor without a rare earth element," Jpn. J. Appl. Phys. 27(2) Feb. 1988 L209-210.
Kawasaki et al, "Compositional and Structural Analyses for Optimizing the preparation conditions of superconducting $(La_{1-x}Sr_x)_y CuO_{4-\delta}$ films by sputtering", Jpn. J. Appl. Phys. 26(4) Apr. 1987 L388-390.
Asano et al, "High-$T_c$ Y-Ba-Cu-O thin films prepared by dual magnetron sputtering", Jpn. J. Appl. Phys. 26(7) Jul. 1987 L221-222.
Gurvitch et al, "Preparation and Substrate Reactions of Superconducting Y-Ba-Cu-O Films", Appl. Phys. Lett. vol. 51(26) Sep. 1987 pp. 1027-1029.
Gavaler et al, "Fabrication of High-$T_c$ Superconducting $YBa_2Cu_3O_7$ Films", MRS (Apr. 1988) (Reno, Nev.) pp. 193-196.

*Primary Examiner*—Roy King
*Attorney, Agent, or Firm*—Kerkam, Stowell, Kondracki & Clarke

[57] ABSTRACT

An outer surface of a superconducting film of compound oxide such as $YBa_2Cu_3O_{7-\delta}$ is protected with a protective layer which is composed of any one of (i) oxide of metal such as MgO, CaO, SrO etc, (ii) carbide such as SiC, or (iii) nitride such as BN.

22 Claims, 1 Drawing Sheet

FIG. 1

METHOD OF FORMING AN INORGANIC PROTECTIVE LAYER ON AN OXIDE SUPERCONDUCTING FILM

This is a division of application Ser. No. 07/215,497 filed Jul. 6, 1988.

BACKGROUND OF THE INVENTION

1. Field of the Invention

The present invention relates to a superconducting thin film and a method for preparing the same. More particularly, it relates to a superconducting thin film of compound oxide having a high critical temperature and also possessing lasting stability for a long period and a method for preparing the same.

2. Description of the Related Art

The superconductivity is a phenomenon which is explained to be a phenomenon of a kind of phase change of electrons under which the electrical resistance become zero and the perfect diamagnetism is observed. Thus, under the superconducting condition, electric current of a very high current density can be delivered without any loss of power.

Therefore, if the superconducting power cable is realized, the power loss of the order of 7% which is inevitable in the conventional power cables can be reduced greatly. Realization of superconducting coils for generating a very high magnetic field is expected to accelerate development in the field of fusion power generation in which the electric power is consumed beyond its output under the present technology, as well as in the field of MHD power generation or motor-generators. The development of superconductivity are demanded also in the other industrial fields such as in the field or electric power reservation; in the field of transportation for example magnetic levitation trains, or magnetically propelling ships; in the medical field such as high-energy beam radiation unit; or in the field of science such as NMR or high-energy physics.

In addition to the abovementioned power electric applications, the superconducting materials can be used in the field of electronics, for example, as a device using the Josephson effect in which quantum efficiency is observed macroscopically when an electric current is passed through a weak junction arranged between two superconducting bodies. Tunnel junction type Josephson device which is a typical application of the Josephson effect is expected to be a high-speed and low-power consuming switching device owing to smaller energy gap of the superconducting material. It is also expected to utilize the Josephson device as a high sensitive sensors or detectors for sensing very weak magnetic field, microwave, radiant ray or the like since variation of electromagnetic wave or magnetic field is reflected in variation of Josephson effect and can be observed as a quantum phenomenon precisely. Development of the superconducting devices is also demanded in the field of high-speed computers in which the power consumption per unit area is reaching to the upper limit of the cooling capacity with increment of the integration density in order to reduce energy consumption.

However, the critical temperature could not exceed 23.2 K of $Nb_3Ge$ which was the highest Tc for all studies for the past ten years.

Possibility of existence of a new type of superconducting materials having much higher Tc was revealed by Bednorz and Müller who discovered a new oxide type superconductor in 1986 [Z. Phys. B64 (1986) 189].

It had been known that certain ceramics material of compound oxides exhibit the property of superconductivity. For example, U.S. Pat. No. 3,932,315 discloses Ba—Pb—Bi type compound oxide which shows superconductivity and Japanese patent laid-open No. 60-173,885 discloses that Ba—Bi type compound oxides also show superconductivity. These superconductors, however, possess rather lower transition temperatures of about 10 K and hence usage of liquidized helium (boiling point of 4.2 K) as cryogen is indispensable to realize superconductivity. The new type compound oxide superconductor discovered by Bednorz and Müeller is represented by $[La, Sr]_2CuO_4$ which is called as the $K_2NiF_4$-type oxide having a crystal structure which is similar to known perovskite type oxides. The $K_2NiF_4$-type oxides show such higher Tc as 30 K which are extremely higher than known superconducting materials.

It was also reported in the newspaper that C. W. Chu et al discovered in the United States of America another superconducting material so called YBCO type represented by $YBa_2Cu_3O_{7-x}$ having the critical temperature of in the order of 90 K in February 1987. Still another type new superconducting material is a compound oxide of Bi—Sr—Ca—Cu—O system and Tl—Ba—Ca—Cu—O system which exhibit such high Tc as more than 100 K and which are chemically much stable than the abovementioned YBCO type compound oxide or the like.

And hence, possibility of existence of high-temperature superconductors have burst on the scene.

A thin film of superconducting compound oxide is prepared by sputtering technique. For example, in Japanese patent laid-open No. 56-109824 which discloses a method for preparing a thin film of superconductor represented by $BaPb_{1-x}Bi_xO_3$ (in which $0.05 \leq x \leq 0.35$), high-frequency sputtering is carried out in an oxygen containing atmosphere and then the resulting film is further heated at 500° to 550° C. We also described sputtering conditions for preparing superconducting thin films of compound oxide by the sputtering technique in a commonly assigned co-pending U.S. patent application Ser. No. 152,714 filed on May 2, 1988, now abandoned.

The abovementioned conventional sputtering technique itself is satisfactory but is helpless against the change in properties during storage.

In fact, the superconductivity or superconducting property of the abovementioned new type superconducting materials of compound oxide is influenced by the oxygen contents in the crystalline structure since the oxygen in the crystal is not stable and is apt to escape out of the crystal, resulting in that the superconductivity is lost or deteriorated with the passing of time.

Therefore, an object of the present invention is to overcome the abovementioned problems of the conventional technique and to provide a superconducting thin film improved in stability during storage or use and a method for preparing the same.

SUMMARY OF THE INVENTION

A superconducting thin film composed of compound oxide and deposited on a substrate according to the present invention is characterized in that an outer surface of the superconducting thin film is covered with a protective layer which is composed of any one of the following materials:

(i) oxide of metal,
(ii) carbide,
(iii) nitride or
(iv) the same material as the substrate.

The oxide of metal of (i) may be any oxide of an element selected from a group comprising a metal element of IIa group, a metal element of IIIa group, a metal element of IVa group, a metal element of Va group, a metal element of VIa group, a metal element of VIIa group, a metal element of VIIIa group, a metal element of Ib group, a metal element of IIb group, a semi-metal element of IIIb group and a semi-metal element of IVb group in the periodic table. More particularly, it can be mentioned one of oxides of following elements: Mg, Ca, Sr, Ba (IIa group); Y, La, lanthanoid (IIIa group); Ti, Zr (IVa group); V, Nb, Ta (Va group); Cr, Mo, W (VIa group); Mn (VIIa group); Fe, Co, Ni (VIIIa group); Cu, Ag (Ib group); Zn, Cd, Hg (IIb group); Al, Ga, In, Tl (IIIb group) and Si, Ge, Sn, Pb (IVb group).

According to the first aspect of the present invention, the protective layer of the present invention may be composed of oxide of at least one of elements selected from a group comprising elements of IIa group, IIIa group, IIIb group and IVb group, particularly, Mg, Ca, Sr, Ba, Zn, Cd, Hg, Al, Ga, In, Tl, Si, Ge, Sn and Pb. Since the oxides of these elements are homologue of or possess very similar properties to components of the superconductor, no undesirable influence is produced when they are deposited on the surface of the superconductor. Still more, the oxides of these elements contain stable oxygen which may advantageously suppress liberation of oxygen from the crystalline superconducting thin film, so that the superconducting property of the thin film can be maintained.

According to second aspect of the present invention, the protective layer of the present invention may be composed of oxide of transition metal, particularly at least one metal selected from a group comprising Ti, Zr, V, Nb, Ta, Cr, Mo, W, Mn, Fe, Co, Ni, Cu and Ag. The oxides of these elements also contain stable oxygen which may advantageously suppress liberation of oxygen from the crystalline superconducting thin film to maintain the superconducting property of the thin film.

According to third aspect of the present invention, the protective layer of the present invention may be composed of oxide of such a metal element or elements that are contained in the superconducting thin film to be produced, such as Ba, Y, Sr or La. Each of these metal oxides is a component of the superconductor of compound oxide to be produced and have no undesirable effect on the superconductor.

The carbide of (ii) may be SiC or TiC each of which may contain other elements such as hydrogen. Since the carbide is chemically stable and hard and produce a protective layer having a high density which may advantageously suppress liberation of oxygen from the crystalline superconducting thin film to maintain the superconducting property of the thin film.

The nitride of (iii) may be SiC or TiC each of which may contain other elements such as hydrogen. Since the nitride is chemically stable or inactive to the superconductor and produce a protective layer having a high density which may advantageously suppress liberation of oxygen from the crystalline superconducting thin film, the superconducting property of the thin film can be maintained for a long time.

In case of (iv), the protective layer may be composed of the same material as the substrate which is made of a single crystal of MgO or SrTiO$_3$. When this material is deposited on the superconducting thin film, the deposited film grows epitaxially so that the crystalline axis of the resulting protective layer can be oriented to a predetermined direction. This means that the resulting protective film has a very high density and can prevent liberation of oxygen out of the superconducting thin film. Of course, this protective layer is inactive to the superconductor.

Selection of the abovementioned protective layers depend on type or system of the compound oxide used.

The superconducting thin film can be composed of compound oxide of an element $\alpha$ selected from IIa group of the Periodic Table, an element $\beta$ selected from IIIa group of the Periodic Table and at least one element $\gamma$ selected from a group comprising Ib, IIb, IIIb, IVb and VIIIa group of the Periodic Table. The element $\gamma$ is copper in general.

Particularly, the superconducting thin film is preferably a compound oxide represented by the general formula:

$$(\alpha_{1-x}\beta_x)Cu_yO_z$$

in which $\alpha$ and $\beta$ means the same definition as above, x is an atomic ratio of $\beta$ with respect to $(\alpha+\beta)$ and has a range of $0.1 \leq x \leq 0.9$, and y and z are respective atomic ratios with respect to $(\alpha_{1-x}\beta_x)$ which is considered to be equal to 1 and each satisfy ranges of $0.4 \leq y \leq 3.0$ and $1 \leq z \leq 5$ respectively.

According to a preferred embodiment of the present invention, the element $\alpha$ is Ba or Sr and the element $\beta$ is at least on element selected from a group comprising Y, La, Gd, Dy, Ho, Er, Tm, Yb, Nd, Sm, Eu and Lu. From 10 to 80% of the element $\alpha$ may be substituted by one or more than one of elements selected from IIa group of the Periodic Table. The element $\beta$ may be a combination of more than two elements selected from IIIa group of the Periodic. A portion of these components can be substituted by at least one of elements selected from a group comprising Al, Fe, Ni, Zn, Ag and Ti.

An atomic ratio of $\alpha$ to $\beta$ depends on the type or system of the compound oxide or on the combination of $\alpha$ and $\beta$. Following atomic ratios are preferably used in case of Ba-Y system, Ba-La system and Sr-La system respectively:

| | |
|---|---|
| Y/(Y + Ba) | 0.06 to 0.94, more preferably 0.1 to 0.4 |
| Ba/(La + Ba) | 0.04 to 0.96, more preferably 0.08 to 0.45 |
| Sr/(La + Sr) | 0.03 to 0.95, more preferably 0.05 to 0.1 |

Thus, the preferable compound oxides are Y-Ba-Cu-O system, La-Ba-Cu-O system and La-Sr-Cu-O system including the following special cases:

| | | |
|---|---|---|
| $Y_1Ba_2Cu_3O_{7-x}$, | $Ho_1Ba_2Cu_3O_{7-x}$, | $Lu_1Ba_2Cu_3O_{7-x}$, |
| $Sm_1Ba_2Cu_3O_{7-x}$, | $Nd_1Ba_2Cu_3O_{7-x}$, | $Gd_1Ba_2Cu_3O_{7-x}$, |
| $Eu_1Ba_2Cu_3O_{7-x}$, | $Er_1Ba_2Cu_3O_{7-x}$, | $Dy_1Ba_2Cu_3O_{7-x}$, |
| $Tm_1Ba_2Cu_3O_{7-x}$, | $Yb_1Ba_2Cu_3O_{7-x}$, | $La_1Ba_2Cu_3O_{7-x}$. |
| $(La,Sr)_2CuO_{4-x}$ | | | in which x is a number which satisfies a range of $0<x<1$.

The abovementioned oxides possess preferably perovskite type or quasi-perovskite type crystal structure. The term of quasi-perovskite type means a structure which can be considered to have such a crystal structure that is similar to Perovskite-type oxides and includes an orthorhombically distorted perovskite or a distorted oxygen-deficient perovskite or the like.

The superconducting thin film may be also another type of superconductor consisting mainly of a compound oxide represented by the formula:

$$\Theta_4(\Phi_{1-q}Ca_q)_m Cu_n O_{p+r}$$

in which $\Theta$ stands for Bi or Tl, $\Phi$ stands for Sr when $\Theta$ is Bi and stands for Ba when $\Theta$ is Tl, m and n are numbers each satisfying ranges of $6 \leq m \leq 10$ and $4 \leq n \leq 8$ respectively, $p=(6+m+n)$, q is a number which satisfies a range of $0<q<1$, and r is a number which satisfies a range of $-2 \leq r \leq +2$. This system is considered to be a single phase of the following compound oxide or a mixed phase consisting mainly thereof:

| | |
|---|---|
| $Bi_4Sr_4Ca_4Cu_6O_{20-r}$, | $Bi_2Sr_2Ca_2Cu_3O_{10-r}$, |
| $Tl_4Ba_4Ca_4Cu_6O_{20-r}$, | $Tl_2Ba_2Ca_2Cu_3O_{10-r}$. | in which r is a number which satisfies a range of $-2 \leq r \leq +2$.

The substrate may be made of glass, quartz, silicon, sapphire, stainless steel or other ceramics. Particularly, the substrate consists preferably of a single crystal of MgO or $SrTiO_3$. Desirably, the superconducting thin film is deposited on a (001) plane or (110) plane of a single crystal of MgO or $SrTiO_3$.

The present invention relates also to a method for preparing a superconducting thin film on a substrate. The method is characterized in that an outer surface of the superconducting thin film is covered with a protective layer which is composed of any one of the following materials:

(i) oxide of metal,
(ii) carbide,
(iii) nitride or
(iv) the same material as the substrate.

The thin film of superconductor can be prepared by the conventional physical vapour deposition technique, such as sputtering, vacuum deposition, ion plating, molecular beam epitaxial growth or the like. It is also possible to use chemical deposition technique (CVD) such as plasma CVD or photo CVD. Generally, the thin film of compound oxide is prepared by sputtering technique.

According to the present invention, more than two protective layers can be formed successively on the superconducting thin film layer. Each protective layer may be different in type and composition from adjacent layers.

According to a preferred embodiment of the present invention, the superconducting thin film is deposited on a substrate by sputtering technique and then a protective layer is deposited on a surface of the superconducting thin film in a common sputtering unit. Namely, the sputtering is preferably carried out by such a manner that, at first, both targets for the superconducting thin film and for the protective layer are set on respective target holders in a chamber, and then the target for the superconducting thin film is sputtered with argon gas or the like while the target for the protective layer is not sputtered. After a superconducting thin film is deposited on a substrate, the target for the protective layer is sputtered to deposit a protective layer on the superconducting thin film.

Such superconducting thin film can be prepared by sputtering technique described in our co-pending U.S. patent application Ser. No. 152,714 filed on May 2, 1988.

The superconducting property can be improved by heat-treatment which is effected after the thin film of compound oxide is deposited on the substrate in oxygen containing atmosphere. The heat-treatment is preferably effected under a partial pressure of oxygen ranging from 0.1 to 150 atm at a temperature between 300° and 1,500° C. After this temperature is maintained for more than one hour, the resulting thin film is cooled slowly at a rate of less than 100° C./min. Advantage of the heat-treatment can not be obtained if the heat-treatment is effected outside the abovementioned conditions. For example, if the thin film is heated at a temperature which is higher than 1,500° C., the abovementioned advantage can not be obtained but the superconductivity will be disappeared.

In case of the compound oxide type superconductor, oxygen deficiency in its crystal is a critical factor for realizing the superconductivity. Particularly, a heat-treatment under a relatively higher partial pressure of oxygen is very preferable and is considered to be indispensable to realize superior superconductivity.

However, it is impossible to prevent the thin film of compound oxide from deterioration which occur during storage even if the thin film is heat-treated completely. The deterioration of superconductivity, in other words a phenomenon that the superconducting property is lost gradually in time may be caused by disappearance or liveration of oxygen in the crystal because the superconductivity of compound oxide is observed in unstable or quasi-stable phase. This is a big problem of compound oxide type superconductors in their actual use.

This problem is solved by the present invention in which an outer surface of the thin film of superconductor is covered by a stable and hard protective layer which has a high density to prevent oxygen from escaping from its crystal structure.

In a stage of deposition of the protective layer on the superconducting thin film, the substrate on which the thin film is deposited should not be heated at a temperature which is higher than 500° C., the superconducting property is damaged because oxygen in its crystal is apt to be lost.

The thin film of compound oxide is preferably deposited on a (001) plane or (110) plane of a single crystal of MgO or $SrTiO_3$. In fact, the thin film of compound oxide possesses anisotropy in its crystal structure, so that a current passing along the direction which is in parallel with a plane defined by a-axis and b-axis of the crystal show a very high critical current density but the other current passing along the other directions is relatively lower. Therefore, when the c-axis is orientated to a direction which is perpendicular to the plane defined by a-axis and b-axis of the crystal, a current which has much higher critical current density (Jc) can be delivered along a direction which is in parallel with the plane.

According to a preferred embodiment of the present invention, the superconducting thin film composed of a single crystal or polycrystals of compound oxide whose c-axis is oriented to a direction which is perpendicular to the plane defined by a-axis and b-axis of the crystal is deposited on a (100) plane of a substrate of single crystal of MgO or $SrTiO_3$ which has such lattice constant or lattice constants in a-axis and/or b-axis that are proximate to those of the thin film such as $Ln_1Ba_2Cu_3O_7$ in order to realize a high critical current density (Jc) along the direction which is in parallel with a surface of the substrate.

In case of (iv) where the protective layer is composed of the same material as the substrate which consists of a single crystal of MgO or $SrTiO_3$, the deposited protective layer grows epitaxially so that the crystalline axis of the resulting protective layer is oriented to a predetermined direction, resulting in that protective film has a very high density and can prevent escape of oxygen out of the superconducting thin film.

It is apparent from the description abovementioned that the superconducting thin film of compound oxide according to the present invention have improved stability that conventional superconducting thin film and hence they can be utilized advantageously in applications of thin film devices, such as Matisoo switching elements or Josephson device, Anacker memory device or Superconducting Quantum Interference Device (SQUID).

Now, the present invention will be described with reference to attached FIG. 1 which illustrates an apparatus used for carrying out the present invention. But, the present invention is not limited thereto.

Figure 1:
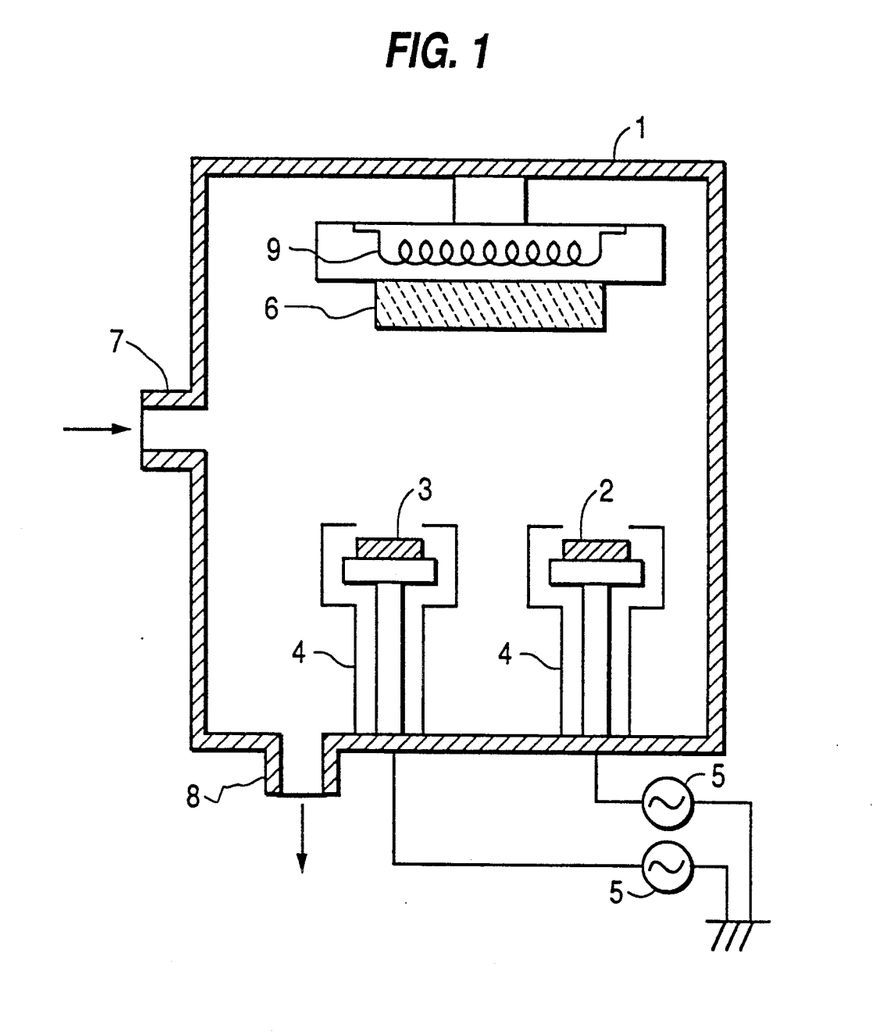
FIG. 1 is an illustrative view of a magnetron sputtering unit which is used in the present invention.

Referring to FIG. 1 illustrating a magnetron sputtering unit which is used in the present invention, the sputtering unit includes, in a chamber 1, two target holders for a superconducting thin film 2 and for a protective layer 3, a pair of magnetron electrodes 4 each surrounding respective targets 2 and 3, high-frequency power sources 5 for actuating the magnetron electrodes 5 and a substrate holder on which a substrate is secured. The chamber 1 has an exhaust port 8 which is connected to a vacuum source (not shown) and a gas inlet port 7 for introducing an atmosphere gas. The substrate holder is provided with a heater 9 for controlling a temperature of the substrate 6. Such sputtering unit itself is known and used in a variety of applications.

In operation, after a substrate 6 is secured to the substrate holder and targets 2 and 3 are set on respective target holder in the chamber 1, vacuum is created in the chamber 1 and a suitable gas such as argon and/or oxygen at a predetermined pressure is introduced into the chamber 1. After the substrate 6 is heated to a predetermined temperature by the heater 9, high-frequency power is applied to one of the magnetron electrodes 4 surrounding the target 2 for the superconducting thin film to start sputtering operation. Introduction of the atmosphere gas in the chamber 1 is controlled at a predetermined pressure during the sputtering operation. The deposition of the superconducting thin film of compound oxide is carried out by the conventional sputtering technique.

After the thin film of compound oxide is deposited, the other magnetron electrode 4 surrounding the target 3 for the protective layer is energized so that a thin film of the protective layer is deposited on the superconducting thin film.

Now, several embodiments of the method according to the present invention will be described by Examples, but the scope of the present invention should not be limited thereto.

In the following Examples, both of the superconducting thin film and the protective layer are prepared in the sputtering unit shown in FIG. 1. For comparison, two series of samples are prepared so that the first series possesses the protective layer while second series do not possess the same.

EXAMPLE 1

Preparation of a target for compound oxide

At first, powders of $Y_2O_3$ and $BaCO_3$ were mixed at an atomic ratio of Y:Ba=1:2 and then a powder of CuO was added to the resulting powder mixture at 10% excessive proportion with respect to an atomic ratio of Y:Ba:Cu=1:2:3. Then, the resulting powder mixture was sintered at 950° C. to obtain a sintered block of $YBa_2Cu_3O_7$ which is used as a target 2 for a superconducting thin film.

Deposition of thin films

The resulting target 2 and a target 3 composed of h-BN are set on respective target holder and a substrate 6 consisting of a single crystal of MgO is secured on the substrate holder. The MgO crystal is set in such manner that its surface on which the thin film is deposited has a (001) plane.

After the chamber 1 is vacuumed, argon gas at a partial pressure of $5.0 \times 10^{-2}$ Torr and oxygen gas at a partial pressure of $1.0 \times 10^{-2}$ Torr are introduced and the substrate is heated at 620° C. Then, the magnetron electrode 4 for the target 2 is energized with high frequency of 3 W/cm² to prepare a thin film of compound oxide of 1 μm on the substrate at a film forming rate of 0.50 Å/sec.

After deposition of the thin film of compound oxide is completed, oxygen gas of 1 atom is introduced in the chamber 1 and the temperature of the substrate is adjusted at 650° C. The deposited thin film is left under this condition for 15 hours and then cooled slowly at a cooling rate of 7° C./min.

Then, another magnetron electrode for the protective layer 3 is energized so that h-BN is sputtered to deposit a protective layer of 2,000 Å on the thin film of compound oxide which is prepared in the abovementioned step. During the deposition of the protective layer, the temperature of the substrate is maintained at 450° C.

Measurement of critical temperature

Resistance of the resulting thin film is measured on such a sample that has vacuum-deposited aluminum electrodes at opposite sides of the thin film of compound oxide deposited on the substrate 6.

Measurement of the critical temperature Tc and Tcf was carried out by a conventional four probe method in which the sample was immersed in liquidized helium to cool the sample down to a temperature of 8K in a cryostat. Then, the temperature dependence of resistance of the sample was determined with rising the temperature gradually to determine a temperature of Tcf at which the perfect superconductivity start to be lost and resistance begin to appear and a temperature of Tc at which the superconductivity is lost and ordinary resistance begin to appear.

Changes of Tcf and Tc are determined by comparing two values observed on same sample just after the protective layer is deposited and after one month.

The result as well as main operational parameters are shown in Table 1.

EXAMPLE 2

The same procedure as Example 1 is repeated except that a sintered block of $LaBa_2Cu_3O_7$ is used as a target for a thin film of compound oxide which is prepared by following procedure.

Preparation of a target for compound oxide

Powders of $La_2O_3$ and $BaCO_3$ were mixed at an atomic ratio of La:Ba=1:2 and then a powder of CuO was added to the resulting powder mixture at 10% excessive proportion with respect to an atomic ratio of Y:Ba:Cu=1:2:3. Then, the resulting powder mixture was sintered at 970° C. to obtain a sintered block of $LaBa_2Cu_3O_7$ which is used as a target 2 for a superconducting thin film.

The result as well as main operational parameters are shown in Table 1.

$YBa_2Cu_3O_7$ which is used as a target 2 for a superconducting thin film.

Deposition of thin films

The resulting target 2 and a target 3 composed of SiC are set on respective target holder and a substrate 6 consisting of a single crystal of MgO is secured on the substrate holder. The MgO crystal is set in such manner that its surface on which the thin film is deposited has a (001) plane.

After the chamber 1 is vacuumed, argon gas at a partial pressure of $5.0 \times 10^{-2}$ Torr and oxygen gas at a partial pressure of $1.0 \times 10^{-2}$ Torr are introduced and the substrate is heated at 630° C. Then, the magnetron electrode 4 for the target 2 is energized with high frequency of 3 $W/cm^2$ to prepare a thin film of compound oxide of 1 μm on the substrate at a film forming rate of 0.50 Å/sec.

After deposition of the thin film of compound oxide is completed, oxygen gas of 1 atom is introduced in the chamber 1 and the temperature of the substrate is adjusted at 650° C. The deposited thin film is left under this condition for 15 hours and then cooled slowly at a cooling rate of 7° C./min.

Then, another magnetron electrode for the protective

TABLE 1

| No. | Partial Pressure of $O_2$ (Torr) | Temperature of Substrate (°C.) | Protective Layer | Just after deposition Tc (K) | Just after deposition Tcf (K) | One month later Tc (K) | One month later Tcf (K) |
|---|---|---|---|---|---|---|---|
| 1 | $1.0 \times 10^{-2}$ | 620 | BN | 91 | 78 | 90 | 78 |
|   |   |   | — | 89 | 77 | 36 | — |
| 2 | $7.0 \times 10^{-3}$ | 680 | BN | 58 | 47 | 59 | 48 |
|   |   |   | — | 57 | 48 | 8 | — |

(Note)
Superconductivity is not observed in liquid helium

EXAMPLE 3

The same procedure as Example 1 is repeated except that the target of h-BN is replaced by a target of TiN.

The result as well as main operational parameters are shown in Table 2.

EXAMPLE 4

The same procedure as Example 2 is repeated except that the target of h-BN is replaced by a target of TiN.

The result as well as main operational parameters are shown in Table 2.

layer 3 is energized so that SiC is sputtered to deposit a protective layer of 2,000 Å on the thin film of compound oxide which is prepared in the abovementioned step. During the deposition of the protective layer, the temperature of the substrate is maintained at 450° C.

Measurement of critical temperature

Measurement of the critical temperature Tc and Tcf was carried by the same method as Example 1. The result as well as main operational parameters are shown in Table 3.

TABLE 2

| No. | Partial Pressure of $O_2$ (Torr) | Temperature of Substrate (°C.) | Protective Layer | Just after deposition Tc (K) | Just after deposition Tcf (K) | One month later Tc (K) | One month later Tcf (K) |
|---|---|---|---|---|---|---|---|
| 3 | $8.0 \times 10^{-3}$ | 730 | TiN | 96 | 85 | 95 | 86 |
|   |   |   | — | 98 | 88 | 33 | — |
| 4 | $5.0 \times 10^{-3}$ | 690 | TiN | 51 | 38 | 53 | 37 |
|   |   |   | — | 49 | 37 | 17 | — |

(Note)
Superconductivity is not observed in liquid helium

EXAMPLE 5

Preparation of a target for compound oxide

At first, powders of $Y_2O_3$ and $BaCO_3$ were mixed at an atomic ratio of Y:Ba=1:2 and then a powder of CuO was added to the resulting powder mixture at 10% excessive proportion with respect to an atomic ratio of Y:Ba:Cu=1:2:3. Then, the resulting powder mixture was sintered at 950° C. to obtain a sintered block of

EXAMPLE 6

The same procedure as Example 5 is repeated except that a sintered block of $LaBa_2Cu_3O_7$ is used as a target for a thin film of compound oxide which is prepared by following procedure.

Preparation of a target for compound oxide

Powders of $La_2O_3$ and $BaCO_3$ were mixed at an atomic ratio of La:Ba=1:2 and then a powder of CuO was added to the resulting powder mixture at 10% excessive proportion with respect to an atomic ratio of Y:Ba:Cu=1:2:3. Then, the resulting powder mixture was sintered at 970° C. to obtain a sintered block of LaBa$_2$Cu$_3$O$_7$ which is used as a target 2 for a superconducting thin film.

The result as well as main operational parameters are shown in Table 3.

electrode 4 for the target 2 is energized with high frequency of 3 W/cm$^2$ to prepare a thin film of compound oxide of 1 μm on the substrate at a film forming rate 0.50 Å/sec.

After deposition of the thin film of compound oxide is completed, oxygen gas of 1 atom is introduced in the

TABLE 3

| No. | Partial Pressure of O$_2$ (Torr) | Temperature of Substrate (°C.) | Protective Layer | Just after deposition Tc (K) | Tcf (K) | One month later Tc (K) | Tcf (K) |
|---|---|---|---|---|---|---|---|
| 5 | 1.0 × 10$^{-2}$ | 630 | SiC | 86 | 72 | 87 | 71 |
|  |  |  | — | 85 | 72 | 33 | — |
| 6 | 7.0 × 10$^{-3}$ | 670 | SiC | 61 | 47 | 60 | 48 |
|  |  |  | — | 62 | 50 | — | — |

(Note)
Superconductivity is not observed in liquid helium

EXAMPLE 7

The same procedure as Example 5 is repeated except that the target of SiC is replaced by a target of TiC.

The result as well as main operational parameters are shown in Table 4.

EXAMPLE 8

The same procedure as Example 6 is repeated except that the target of SiC is replaced by a target of TiC.

The result as well as main operational parameters are shown in Table 4.

chamber 1 and the temperature of the substrate is adjusted at 650° C. The deposited thin film is left under this condition for 15 hours and then cooled slowly at a cooling rate of 7° C./min.

Then, another magnetron electrode for the protective layer 3 is energized so that MgO is sputtered to deposit a protective layer of 2,000 Å on the thin film of compound oxide which is prepared in the abovementioned step. During the deposition of the protective layer, the temperature of the substrate is maintained at 450° C.

Measurement of critical temperature

TABLE 4

| No. | Partial Pressure of O$_2$ (Torr) | Temperature of Substrate (°C.) | Protective Layer | Just after deposition Tc (K) | Tcf (K) | One month later Tc (K) | Tcf (K) |
|---|---|---|---|---|---|---|---|
| 7 | 8.0 × 10$^{-3}$ | 710 | TiC | 93 | 82 | 94 | 81 |
|  |  |  | — | 91 | 80 | 31 | — |
| 8 | 5.0 × 10$^{-3}$ | 685 | TiC | 53 | 39 | 51 | 38 |
|  |  |  | — | 52 | 38 | — | — |

(Note)
Superconductivity is not observed in liquid helium

EXAMPLE 9

Preparation of a target for compound oxide

At first, powders of Y$_2$O$_3$ and BaCO$_3$ were mixed at an atomic ratio of Y:Ba=1:2 and then a powder of CuO was added to the resulting powder mixture at 10% excessive proportion with respect to an atomic ratio of Y:Ba:Cu=1:2:3. Then, the resulting powder mixture was sintered at 950° C. to obtain a sintered block of YBa$_2$Cu$_3$O$_7$ which is used as a target 2 for a superconducting thin film.

Deposition of thin films

The resulting target 2 and a powder target 3 composed of MgO powder are set on respective target holder and a substrate 6 consisting of a single crystal of MgO is secured on the substrate holder. The substrate of MgO crystal is set in such manner that its surface on which the thin film is deposited has a (001) plane.

After the chamber 1 is vacuumed, argon gas at a partial pressure of 5.0×10$^{-2}$ Torr and oxygen gas at a partial pressure of 1.0×10$^{-2}$ torr are introduced and the substrate is heated at 650° C. Then, the magnetron Measurement of the critical temperature Tc and Tcf was carried by the same method as Example 1. The result as well as main operational parameters are shown in Table 5.

EXAMPLE 10

The same procedure as Example 9 is repeated except that a sintered block of LaBa$_2$Cu$_3$O$_7$ is used as a target for a thin film of compound oxide which is prepared by following procedure.

Preparation of a target for compound oxide

Powders of La$_2$O$_3$ and BaCO$_3$ were mixed at an atomic ratio of La:Ba=1:2 and then a powder of CuO was added to the resulting powder mixture at 10% excessive proportion with respect to an atomic ratio of Y:Ba:Cu=1:2:3. Then, the resulting powder mixture was sintered at 970° C. to obtain a sintered block of LaBa$_2$Cu$_3$O$_7$ which is used as a target 2 for a superconducting thin film.

The result as well as main operational parameters are shown in Table 5.

TABLE 5

| No. | Partial Pressure of O$_2$ (Torr) | Temperature of Substrate (°C.) | Protective Layer | Jc (A/cm$^2$) | Just after deposition Tc (K) | Tcf (K) | One month later Tc (K) | Tcf (K) |
|---|---|---|---|---|---|---|---|---|
| 11 | 8.0 × 10$^{-3}$ | 700 | SrTiO$_3$ | 2 × 10$^6$ | 89 | 76 | 88 | 77 |
| 9 | 1.0 × 10$^{-2}$ | 650 | MgO | 3 × 10$^6$ | 79 | 67 | 77 | 68 |
|  |  |  | — | 1 × 10$^5$ | 78 | 68 | 11 | — |
| 10 | 7.0 × 10$^{-3}$ | 620 | MgO | 5 × 10$^5$ | 56 | 39 | 56 | 38 |

TABLE 5-continued

| No. | Partial Pressure of $O_2$ (Torr) | Temperature of Substrate (°C.) | Protective Layer | Jc (A/cm$^2$) | Just after deposition Tc (K) | Tcf (K) | One month later Tc (K) | Tcf (K) |
|---|---|---|---|---|---|---|---|---|
| | | | — | $8 \times 10^3$ | 55 | 40 | — | — |

(Note)
Superconductivity is not observed in liquid helium

EXAMPLE 11

The same procedure as Example 9 is repeated except that the powder target of MgO is replaced by a target of SrTiO$_3$ block.

The result as well as main operational parameters are shown in Table 6.

EXAMPLE 12

The same procedure as Example 10 is repeated except that the substrate of MgO is replaced by a substrate composed of a single crystal of SrTiO$_3$ and that the target of powder MgO is also replaced by a target of SrTiO$_3$. The thin film of compound oxide is deposited on (100) plane of the substrate of SrTiO$_3$ block.

The result as well as main operational parameters are shown in Table 6.

electrode 4 for the target 2 is energized with high frequency of 3 W/cm$^2$ to prepare a thin film of compound oxide of 1 μm on the substrate at a film forming rate of 0.50 Å/sec.

After deposition of the thin film of compound oxide is completed, oxygen gas of 1 atom is introduced in the chamber 1 and the temperature of the substrate is adjusted at 650° C. The deposited thin film is left under this condition for 15 hours and then cooled slowly at a cooling rate of 7° C./min.

Then, another magnetron electrode for the protective layer 3 is energized so that MgO is sputtered to deposit a protective layer of 2,000 Å on the thin film of compound oxide which is prepared in the abovementioned step. During the deposition of the protective layer, the temperature of the substrate is maintained at 450° C.

TABLE 6

| No. | Partial Pressure of $O_2$ (Torr) | Temperature of Substrate (°C.) | Protective Layer | Jc (A/cm$^2$) | Just after deposition Tc (K) | Tcf (K) | One month later Tc (K) | Tcf (K) |
|---|---|---|---|---|---|---|---|---|
| 11 | $8.0 \times 10^{-3}$ | 700 | SrTiO$_3$ | $2 \times 10^6$ | 89 | 76 | 88 | 77 |
| | | | — | $9 \times 10^4$ | 90 | 78 | 25 | — |
| 12 | $5.0 \times 10^{-3}$ | 640 | SrTiO$_3$ | $7 \times 10^5$ | 49 | 34 | 48 | 35 |
| | | | — | $3 \times 10^4$ | 48 | 26 | — | — |

(Note)
Superconductivity is not observed in liquid helium

EXAMPLE 13

Preparation of a target for compound oxide

At first, powders of Y$_2$O$_3$ and BaCO$_3$ were mixed at an atomic ratio of Y:Ba=1:2 and then a powder of CuO was added to the resulting powder mixture at 10% excessive proportion with respect to an atomic ratio of Y:Ba:Cu=1:2:3. Then, the resulting powder mixture was sintered at 950° C. to obtain a sintered block of YBa$_2$Cu$_3$O$_7$ which is used as a target 2 for a superconducting thin film.

Deposition of thin films

The resulting target 2 and a target 3 composed of MgO are set on respective target holder and a substrate 6 consisting of a single crystal of MgO is secured on the substrate holder. The MgO crystal is set in such manner that its surface on which the thin film is deposited has a (001) plane.

After the chamber 1 is vacuumed, argon gas at a partial pressure of $5.0 \times 10^{-2}$ Torr and oxygen gas at a partial pressure of $1.0 \times 10^{-2}$ Torr are introduced and the substrate is heated at 600° C. Then, the magnetron

Measurement of critical temperature

Measurement of the critical temperature Tc and Tcf was carried by the same method as Example 1. The result as well as main operational parameters are shown in Table 7.

EXAMPLE 14

The same procedure as Example 13 is repeated except that a sintered block of LaBa$_2$Cu$_3$O$_7$ is used as a target for a thin film of compound oxide which is prepared by following procedure.

Preparation of a target for compound oxide

Powders of La$_2$O$_3$ and BaCO$_3$ were mixed at an atomic ratio of La:Ba=1:2 and then a powder of CuO was added to the resulting powder mixture at 10% excessive proportion with respect to an atomic ratio of Y:Ba:Cu=1:2:3. Then, the resulting powder mixture was sintered at 970° C. to obtain a sintered block of LaBa$_2$Cu$_3$O$_7$ which is used as a target 2 for a superconducting thin film.

The result as well as main operational parameters are shown in Table 7.

TABLE 7

| No. | Partial Pressure of $O_2$ (Torr) | Temperature of Substrate (°C.) | Protective Layer | Just after deposition Tc (K) | Tcf (K) | One month later Tc (K) | Tcf (K) |
|---|---|---|---|---|---|---|---|
| 13 | $1.0 \times 10^{-2}$ | 600 | MgO | 89 | 71 | 90 | 72 |
| | | | — | 77 | 68 | 39 | — |
| 14 | $7.0 \times 10^{-3}$ | 700 | MgO | 54 | 36 | 55 | 37 |
| | | | — | 55 | 34 | 18 | — |

(Note)
Superconductivity is not observed in liquid helium

EXAMPLE 15

The same procedure as Example 13 is repeated except that the target of MgO is replaced by a target of $SiO_2$.

The result as well as main operational parameters are shown in Table 8.

EXAMPLE 16

The same procedure as Example 14 is repeated except that the target of MgO is replaced by a target of $SiO_2$.

The result as well as main operational parameters are shown in Table 8.

this condition for 15 hours and then cooled slowly at a cooling rate of 7° C./min.

Then, another magnetron electrode for the protective layer 3 is energized so that $TiO_2$ is sputtered to deposit a protective layer of 2,000 Å on the thin film of compound oxide which is prepared in the abovementioned step. During the deposition of the protective layer, the temperature of the substrate is maintained at 450° C.

Measurement of critical temperature

Measurement of the critical temperature Tc and Tcf was carried out by the same method as Example 1. The

TABLE 8

| No. | Partial Pressure of $O_2$ (Torr) | Temperature of Substrate (°C.) | Protective Layer | Just after deposition | | One month later | |
|---|---|---|---|---|---|---|---|
| | | | | Tc (K) | Tcf (K) | Tc (K) | Tcf (K) |
| 15 | $8.0 \times 10^{-3}$ | 650 | $SiO_2$ | 95 | 77 | 94 | 78 |
| | | | — | 92 | 75 | 34 | — |
| 16 | $5.0 \times 10^{-3}$ | 680 | $SiO_2$ | 47 | 35 | 48 | 37 |
| | | | — | 46 | 36 | 20 | — |

(Note)
Superconductivity is not observed in liquid helium

EXAMPLE 17

Preparation of a target for compound oxide

At first, powders of $Y_2O_3$ and $BaCO_3$ were mixed at an atomic ratio of Y:Ba=1:2 and then a powder of CuO was added to the resulting powder mixture at 10% excessive proportion with respect to an atomic ratio of Y:Ba:Cu=1:2:3. Then, the resulting powder mixture was sintered at 950° C. to obtain a sintered block of $YBa_2Cu_3O_7$ which is used as a target 2 for a superconducting thin film.

Deposition of thin films

The resulting target 2 and a target 3 composed of $TiO_2$ are set on respective target holder and a substrate 6 consisting of a single crystal of MgO is secured on the substrate holder. The MgO crystal is set in such manner that its surface on which the thin film is deposited has a (001) plane.

After the chamber 1 is vacuumed, argon gas at a partial pressure of $5.0 \times 10^{-2}$ Torr and oxygen gas at a partial pressure of $1.0 \times 10^{-2}$ Torr are introduced and the substrate is heated at 600° C. Then, the magnetron electrode 4 for the target 2 is energized with high frequency of 3 W/cm$^2$ to prepare a thin film of compound oxide of 1 μm on the substrate at a film forming rate of 0.50 Å/sec.

After deposition of the thin film of compound oxide is completed, oxygen gas of 1 atom is introduced in the chamber 1 and the temperature of the substrate is adjusted at 650° C. The deposited thin film is left under result as well as main operational parameters are shown in Table 9.

EXAMPLE 18

The same procedure as Example 17 is repeated except that a sintered block of $LaBa_2Cu_3O_7$ is used as a target for a thin film of compound oxide which is prepared by following procedure.

Preparation of a target for compound oxide

Powders of $La_2O_3$ and $BaCO_3$ were mixed at an atomic ratio of La:Ba=1:2 and then a powder of CuO was added to the resulting powder mixture at 10% excessive proportion with respect to an atomic ratio of Y:Ba:Cu=1:2:3. Then, the resulting powder mixture was sintered at 970° C. to obtain a sintered block of $LaBa_2Cu_3O_7$ which is used as a target 2 for a superconducting thin film.

The result as well as main operational parameters are shown in Table 9.

TABLE 9

| No. | Partial Pressure of $O_2$ (Torr) | Temperature of Substrate (°C.) | Protective Layer | Just after deposition | | One month later | |
|---|---|---|---|---|---|---|---|
| | | | | Tc (K) | Tcf (K) | Tc (K) | Tcf (K) |
| 17 | $1.0 \times 10^{-2}$ | 600 | $TiO_2$ | 88 | 72 | 89 | 71 |
| | | | — | 79 | 67 | 41 | — |
| 18 | $7.0 \times 10^{-3}$ | 700 | $TiO_2$ | 57 | 39 | 56 | 41 |
| | | | — | 58 | 36 | 21 | — |

(Note)
Superconductivity is not observed in liquid helium

EXAMPLE 19

The same procedure as Example 17 is repeated except that the target of $TiO_2$ is replaced by a target of $ZrO_2$.

The result as well as main operational parameters are shown in Table 10.

EXAMPLE 20

The same procedure as Example 18 is repeated except that the target of $TiO_2$ is replaced by a target of $ZrO_2$.

The result as well as main operational parameters are shown in Table 10.

TABLE 10

| No. | Partial Pressure of $O_2$ (Torr) | Temperature of Substrate (°C.) | Protective Layer | Just after deposition Tc (K) | Just after deposition Tcf (K) | One month later Tc (K) | One month later Tcf (K) |
| --- | --- | --- | --- | --- | --- | --- | --- |
| 19 | $8.0 \times 10^{-3}$ | 650 | $ZrO_2$ | 93 | 77 | 95 | 76 |
|  |  |  | — | 91 | 76 | 38 | — |
| 20 | $5.0 \times 10^{-3}$ | 680 | $ZrO_2$ | 48 | 36 | 49 | 37 |
|  |  |  | — | 47 | 34 | 21 | — |

(Note)
Superconductivity is not observed in liquid helium

EXAMPLE 21

Preparation of a target for compound oxide

At first, powders of $Y_2O_3$ and $BaCO_3$ were mixed at an atomic ratio of Y:Ba=1:2 and then a powder of CuO was added to the resulting powder mixture at 10% excessive proportion with respect to an atomic ratio of Y:Ba:Cu=1:2:3. Then, the resulting powder mixture was sintered at 950° C. to obtain a sintered block of $YBa_2Cu_3O_7$ which is used as a target 2 for a superconducting thin film.

Deposition of thin films

The resulting target 2 and a target 3 composed of $Y_2O_3$ are set on respective target holder and a substrate 6 consisting of a single crystal of MgO is secured on the substrate holder. The MgO crystal is set in such manner that its surface on which the thin film is deposited has a (001) plane.

After the chamber 1 is vacuumed, argon gas at a partial pressure of $5.0 \times 10^{-2}$ Torr and oxygen gas at a partial pressure of $1.0 \times 10^{-2}$ Torr are introduced and the substrate is heated at 680° C. Then, the magnetron electrode 4 for the target 2 is energized with high frequency of 3 W/cm² to prepare a thin film of compound oxide of 1 μm on the substrate at a film forming rate of 0.50 Å/sec.

After deposition of the thin film of compound oxide is completed, oxygen gas of 1 atom is introduced in the chamber 1 and the temperature of the substrate is adjusted at 650° C. The deposited thin film is left under this condition for 15 hours and then cooled slowly at a cooling rate of 7° C./min.

Then, another magnetron electrode for the protective layer 3 is energized so that $Y_2O_3$ is sputtered to deposit a protective layer of 2,000 Å on the thin film of compound oxide which is prepared in the abovementioned step. During the deposition of the protective layer, the temperature of the substrate is maintained at 430° C.

Measurement of critical temperature

Measurement of the critical temperature Tc and Tcf was carried out by the same method as Example 1. The result as well as main operational parameters are shown in Table 11.

EXAMPLE 22

The same procedure as Example 21 is repeated except that a sintered block of $LaBa_2Cu_3O_7$ is used as a target for a thin film of compound oxide which is prepared by following procedure.

Preparation of a target for compound oxide

Powders of $La_2O_3$ and $BaCO_3$ were mixed at an atomic ratio of La:Ba=1:2 and then a powder of CuO was added to the resulting powder mixture at 10% excessive proportion with respect to an atomic ratio of Y:Ba:Cu=1:2:3. Then, the resulting powder mixture was sintered at 970° C. to obtain a sintered block of $LaBa_2Cu_3O_7$ which is used as a target 2 for a superconducting thin film.

Deposition of thin films

The resulting target 2 and a target 3 composed of $La_2O_3$ are set on respective target holder and a substrate 6 consisting of a single crystal of MgO is secured on the substrate holder. The MgO crystal is set in such manner that its surface on which the thin film is deposited has a (001) plane.

After the chamber 1 is vacuumed, argon gas at a partial pressure of $5.0 \times 10^{-2}$ Torr and oxygen gas at a partial pressure of $1.0 \times 10^{-2}$ Torr are introduced and the substrate is heated at 680° C. Then, the magnetron electrode 4 for the target 2 is energized with high frequency of 3 W/cm² to prepare a thin film of compound oxide of 1 μm on the substrate at a film forming rate of 0.50 Å/sec.

After deposition of the thin film of compound oxide is completed, oxygen gas of 1 atom is introduced in the chamber 1 and the temperature of the substrate is adjusted at 730° C. The deposited thin film is left under this condition for 20 hours and then cooled slowly at a cooling rate of 8° C./min.

Then, another magnetron electrode for the protective layer 3 is energized so that $La_2O_3$ is sputtered to deposit a protective layer of 2,000 Å on the thin film of compound oxide which is prepared in the abovementioned step. During the deposition of the protective layer, the temperature of the substrate is maintained at 380° C.

The result as well as main operational parameters are shown in Table 11.

TABLE 11

| No. | Partial Pressure of $O_2$ (Torr) | Temperature of Substrate (°C.) | Protective Layer | Just after deposition Tc (K) | Just after deposition Tcf (K) | One month later Tc (K) | One month later Tcf (K) |
| --- | --- | --- | --- | --- | --- | --- | --- |
| 21 | $1.0 \times 10^{-2}$ | 680 | $Y_2O_3$ | 88 | 72 | 89 | 71 |
|  |  |  | — | 79 | 67 | 41 | — |
| 22 | $7.0 \times 10^{-3}$ | 710 | $La_2O_3$ | 57 | 39 | 56 | 41 |
|  |  |  | — | 58 | 36 | 11 | — |

(Note)
Superconductivity is not observed in liquid helium

EXAMPLE 23

The same procedure as Example 21 is repeated except that the target of $Y_2O_3$ is replaced by a target of $BaTiO_3$.

The result as well as main operational parameters are shown in Table 12.

EXAMPLE 24

The same procedure as Example 22 is repeated except that the target of $Y_2O_3$ is replaced by a target of $BaTiO_3$.

The result as well as main operational parameters are shown in Table 12.

TABLE 12

| No. | Partial Pressure of $O_2$ (Torr) | Temperature of Substrate (°C.) | Protective Layer | Just after deposition Tc (K) | Just after deposition Tcf (K) | One month later Tc (K) | One month later Tcf (K) |
|---|---|---|---|---|---|---|---|
| 23 | $8.0 \times 10^{-3}$ | 640 | $BaTiO_3$ | 93 | 77 | 95 | 76 |
|  |  |  | — | 91 | 76 | 38 | — |
| 24 | $5.0 \times 10^{-3}$ | 670 | $BaTiO_3$ | 48 | 36 | 49 | 37 |
|  |  |  | — | 47 | 34 | — | — |

(Note)
Superconductivity is not observed in liquid helium

What is claimed are:

1. A method for preparing an oxide superconducting film on a substrate, which comprises that an outer surface of the superconducting film is covered with a non-amorphous protective layer containing no halogen, but which is composed of a material selected from the group consisting of:
   (i) an oxide of Mg, Ca, Sr, Cd, Hg, Ga, In, Tl and mixtures thereof;
   (ii) SiC and TiC; and
   (iii) BN and TiN;
said protective layer having a density and being applied under conditions such that oxygen is prevented from escaping from said superconducting film; said oxide superconducting film and said protective layer being prepared by a physical vapour deposition method.

2. A method set forth in claim 1, wherein said superconducting film is a film of compound oxide composed of an element α selected from IIa group of the Periodic Table, an element β selected from IIIa group of the Periodic Table, an element γ selected from copper and copper plus an element selected from the group consisting of Ib other than copper, IIb, IIIb, IVb and VIIIa group of the Periodic Table and oxygen.

3. A method set forth in claim 2, wherein said superconducting film is a film of compound oxide represented by the formula:

$$(\alpha_{1-x}\beta_x)Cu_yO_z$$

in which α and β have the same definition as claim 2, x is an atomic ratio of β with respect to (α+β) and has a range of $0.1 \leq x \leq 0.9$, and y and z are respective atomic ratios with respect to $(\alpha_{1-x}\beta_x)$ which is equal to 1 and each satisfies ranges of $0.4 \leq y \leq 3.0$ and $1 \leq z \leq 5$ respectively.

4. A method set forth in claim 3, wherein said element α is Ba and said element β is at least one element selected from the group consisting of Y, La, Gd, Dy, Ho, Er, Tm, Yb, Nd, Sm, Eu and Lu.

5. A method set forth in claim 3, wherein said element α is Sr and said element β is La.

6. A method set forth in claim 3, wherein said superconducting film has perovskite or quasi-perovskite crystal structure.

7. A method set forth in claim 1, wherein said superconducting film is a film of compound oxide represented by the formula:

$$\Theta_4(\Phi_{1-q}, Ca_q)_m Cu_n O_{p+r}$$

in which Θ stands for Bi or Tl, Φ stands for Sr when Θ is Bi and stands for Ba when Θ is Tl, m and n are numbers each satisfying ranges of $6 \leq m \leq 10$ and $4 \leq n \leq 8$ respectively, $p = (6+m+n)$, q is a number which satisfies a range of $0 < q < 1$, and r is a number which satisfies a range of $-2 \leq r \leq +2$.

8. A method set forth in claim 1, wherein said substrate is made of glass, quartz, silicon, sapphire, stainless steel or ceramics.

9. A method set forth in claim 8, wherein said substrate is a single crystal of MgO or $SrTiO_3$.

10. A method set forth in claim 9, wherein said superconducting film is deposited on a (001) plane or (110) plane of a single crystal of MgO or $SrTiO_3$.

11. A method set forth in claim 1, wherein, during the physical vapour deposition, the substrate is heated at a temperature ranging from 230° C. to 1,410° C.

12. A method set forth in claim 2, wherein, after the film of compound oxide is deposited, the deposited film is heated at a temperature ranging from 300° C. to 1,500° C. in an oxygen containing atmosphere and then is covered with the protective layer.

13. A method for preparing an oxide superconducting film on a substrate by physical vapour deposition technique in which a vapour source contains at least an element α selected from IIa group of the Periodic Table, an element β selected from IIIa group of the Periodic Table and an element γ selected from copper and copper plus an element selected from the group consisting of Ib other than copper, IIb, IIIb, IVb and VIIIa group of the Periodic Table so that a film of compound oxide is deposited on the substrate and heat-treated to form the oxide superconducting film, which comprises that an outer surface of the oxide superconducting film is covered with a non-halogen containing, non-amorphous protective layer which is deposited by physical vapour deposition technique and which is composed of a material selected from the group consisting of:
   (i) an oxide of Mg, Ca, Sr, Cd, Hg, Ga, In, Tl and mixtures thereof;
   (ii) SiC and TiC; and
   (iii) BN and TiN.

14. A method set forth in claim 13, wherein said physical vapour deposition is performed by sputtering.

15. A method set forth in claim 13, wherein said vapour source is composed of a compound oxide represented by the formula:

$$(\alpha_{1-x}\beta_x)\gamma_yO_z$$

in which $\alpha$, $\beta$ and $\gamma$ have the same definition as claim 13, x is an atomic ratio of $\beta$ with respect to $(\alpha+\beta)$ and has a range of $0.1 \leq x \leq 0.9$, and y and z are respective atomic ratios with respect to $(\alpha_{1-x}\beta_x)$ which is equal to 1 and each satisfies ranges of $0.4 \leq y \leq 3.0$ and $1 \leq z \leq 5$ respectively.

16. A method set forth in claim 15, wherein said vapour source consists of a sintered mass or a powder which is prepared by pulverizing the sintered mass, said sintered mass being prepared by sintering a mixture which contains said elements $\alpha$, $\beta$ and $\gamma$ in a form of respective element, oxide, carbonate, nitrate or sulfate of said $\alpha$, $\beta$ and $\gamma$ at a temperature ranging from 220° to 1,260° C.

17. A method set forth in claim 13, said vapour source consists of multiple sputtering targets.

18. A method set forth in claim 13, wherein the partial pressure of oxygen in an atmosphere of vaporization is within a range of from $1.0 \times 10^{-8}$ to $1.0 \times 10^{-1}$ Torr.

19. A method set forth in claim 13, wherein said substrate is heated at a temperature ranging from 230° to 1,410° C.

20. A method set forth in claim 13, wherein, after the film of compound oxide is deposited, the deposited film is heat-treated in an oxygen containing atmosphere and then is covered with the protective layer.

21. A method set forth in claim 20, wherein the heat-treatment of the deposited film is carried out at a temperature ranging from 300° to 1,500° C. and then the resulting heat-treated film is cooled slowly at a rate of less than 100° C./min.

22. A method set forth in claim 13, wherein, during the deposition of the protective layer, the substrate is maintained at a temperature of lower than 500° C.

* * * * *

UNITED STATES PATENT AND TRADEMARK OFFICE
CERTIFICATE OF CORRECTION

PATENT NO.   : 5,252,547
DATED        : October 12, 1993
INVENTOR(S)  : Hideo ITOZAKI, ET AL It is certified that error appears in the above-identified patent and that said Letters Patent is hereby corrected as shown below:

On the title page, under "[30] Foreign Application Priority Data" the second and third entries should read as follows:

-- Jul. 6, 1987 [JP] ..................... 62-168356 --
-- Jul. 10, 1987 [JP] ..................... 62-172696 --

Signed and Sealed this

Twenty-first Day of June, 1994

Attest:

BRUCE LEHMAN

Attesting Officer          Commissioner of Patents and Trademarks